(12) United States Patent
Zumeris et al.

(10) Patent No.: US 6,617,759 B1
(45) Date of Patent: Sep. 9, 2003

(54) CONVEYING MEANS AND METHOD

(75) Inventors: Jona Zumeris, Nesher (IL); Izhak Rafaeli, Haifa (IL)

(73) Assignee: Nanomotion Ltd., Yokneam (IL)

( * ) Notice: Subject to any disclaimer, the term of this patent is extended or adjusted under 35 U.S.C. 154(b) by 0 days.

(21) Appl. No.: 09/555,536

(22) PCT Filed: Dec. 15, 1997

(86) PCT No.: PCT/IL97/00410

§ 371 (c)(1),
(2), (4) Date: Jul. 19, 2001

(87) PCT Pub. No.: WO99/31740

PCT Pub. Date: Jun. 24, 1999

(51) Int. Cl.⁷ ................................................. H02N 2/00
(52) U.S. Cl. ........................... 310/323.17; 310/323.01; 310/328
(58) Field of Search ................. 310/323.01, 323.17, 310/328

(56) References Cited

U.S. PATENT DOCUMENTS

| | | | | |
|---|---|---|---|---|
| 4,613,782 A | * | 9/1986 | Mori et al. ............ | 310/323.16 |
| RE33,390 E | * | 10/1990 | Sashida .................. | 310/323.03 |
| 4,999,536 A | * | 3/1991 | Toda ...................... | 310/323.02 |
| 5,017,820 A | * | 5/1991 | Culp ....................... | 310/328 |
| 5,085,423 A | * | 2/1992 | Nishimoto et al. ...... | 271/18.2 |
| 5,132,582 A | * | 7/1992 | Hayashi et al. ........ | 310/323.16 |
| 5,140,215 A | * | 8/1992 | Yamaguchi ............ | 310/323.16 |
| 5,233,258 A | | 8/1993 | Myoga et al. .......... | 310/323.01 |
| 5,416,375 A | * | 5/1995 | Funakubo et al. ...... | 310/317 |
| 5,424,597 A | * | 6/1995 | Gloss et al. ............ | 310/328 |
| 5,499,808 A | * | 3/1996 | Nishimoto et al. ..... | 271/267 |
| 5,563,465 A | * | 10/1996 | Nakahara et al. ...... | 310/317 |
| 5,616,980 A | | 4/1997 | Zumeris ................. | 310/323.17 |
| 5,640,063 A | * | 6/1997 | Zumeris et al. ........ | 310/317 |
| 5,852,336 A | * | 12/1998 | Takagi ................... | 310/323.01 |
| 5,942,837 A | * | 8/1999 | Reuter ................... | 310/328 |
| 6,091,179 A | * | 7/2000 | Tobe et al. ............. | 310/323.01 |

FOREIGN PATENT DOCUMENTS

| | | | |
|---|---|---|---|
| EP | 0 642 180 | 3/1995 | ........... H01L/41/09 |
| EP | 0 712 170 A | 5/1996 | ........... H01L/41/09 |
| JP | 62-6-482 | * 3/1987 | ........... H02N/2/00 |
| JP | 6-6989 | * 1/1994 | ........... H02N/2/00 |
| SU | 693493 | 10/1970 | ........... H01L/41/10 |

OTHER PUBLICATIONS

Patents Abstracts of Japan vol. 013; No. 126 (E–734); Mar. 28, 1989 & JP 63–294271 A; NEC Corp.; Nov. 30, 1988.
Patents Abstracts of Japan vol. 013; No. 126 (E–734); Mar. 28, 1989 & JP 63–294272 A; NEC Corp.; Nov. 30, 1988.

* cited by examiner

Primary Examiner—Thomas M. Dougherty
(74) Attorney, Agent, or Firm—Fenster & Company

(57) ABSTRACT

Apparatus for providing linear motion to a generally flat flexible material, comprising: (a) at least one piezoelectric ceramic motor situated on a first side of the flat flexible material and having a contact surface which contacts the flat flexible material and which imparts said linear motion; and (b) a bearing surface situated on a second side of the flat flexible material opposite said contact surface.

42 Claims, 6 Drawing Sheets

CONVEYING MEANS AND METHOD

RELATED APPLICATIONS

The present application is a U.S. national application of PCT/IL97/00410, filed Dec. 15, 1997.

FIELD OF THE INVENTION

The present invention relates to linear motion and to piezoelectric motors generally and more particularly to the use of piezoelectric motors for moving delicate materials, such as paper.

BACKGROUND OF THE INVENTION

Linear motion and piezoelectric motors are known in the art. SU 693493 describes a piezoelectric motor comprising a flat rectangular piezoelectric plate having one electrode covering essentially all of one large face of the plate ("the back face") and four electrodes each covering a quadrant of the front face. The back electrode is grounded and the electrodes of the front face are electrically connected on the diagonal. Two ceramic pads are attached to one of the long edges of the plate and these pads are pressed against the object to be moved by a spring mechanism which presses the other long edge.

The long and short edges of the piezoelectric ceramic have similar resonant frequencies (for different mode orders) such that, when one pair of connected electrodes is excited with an alternating current (AC) voltage to which the ceramic is responsive, the object moves in one direction, and when the other pair of electrodes is excited, the object moves in the other direction.

SUMMARY OF THE PRESENT INVENTION

One aspect of the present invention is concerned with the transport of flexible materials such as paper and cloth.

In a preferred embodiment of the invention a piezoelectric motor is used to move the material.

There is thus provided, in accordance with a preferred embodiment of the invention, apparatus for providing linear motion to a generally flat flexible material, comprising:
  (a) at least one piezoelectric ceramic motor situated on a first side of the flat flexible material and having a contact surface which contacts the flat flexible material and which imparts said linear motion; and
  (b) a bearing surface situated on a second side of the flat flexible material opposite said contact surface.

In one preferred embodiment of the invention the bearing surface is the surface of a roller. In other preferred embodiments of the invention, the bearing surface is a contact surface associated with a second piezoelectric motor.

In these other preferred embodiments of the invention, the bearing surface is a contact surface of a second piezoelectric motor and the second piezoelectric motor also imparts said linear motion to the flat flexible material via said contact surface, preferably the at least one and the second piezoelectric motors both impart linear motion to the flexible material in the same direction.

In one of these other preferred embodiments of the invention, the at least one and second piezoelectric motors impart said linear motion in a given direction during motion periods which alternate with periods during which said motion is not applied and the motion periods of the at least one and the second piezoelectric motors at least partially overlap. Preferably, the motion periods of one of the at least one and the second piezoelectric motors is fully contained within the motion period of the other piezoelectric motor. Preferably, the motion periods of the at least one and the second piezoelectric motors coincide.

Preferably, the contact surfaces of the at least one piezoelectric motor and the second piezoelectric motor are displaced toward the flexible material during their respective periods of motion such that the material is pinched between the respective contact surfaces.

Alternatively the contact surface of the at least one piezoelectric motor is displaced toward the flexible material during the period of motion of the at least one piezoelectric motor and wherein the contact surface of the second piezoelectric motor is displaced away from the flexible material during the period of motion of the at least one piezoelectric motor. Preferably, the contact surface of the second piezoelectric motor is displaced toward the flexible material during the period of motion of the second piezoelectric motor and the contact surface of the at least one piezoelectric motor is displaced away from the flexible material during the period of motion of the second piezoelectric motor, such that the at least one piezoelectric motor and second piezoelectric motor alternately apply motion to the flexible material. While it might be expected that this apparatus would not operate since the flexible material would move from side to side, remaining in contact with both motors and thus not moving at all. However, it appears that even the relatively low mass and stiffness of paper is sufficient to allow for the motors to independently move the material.

In a preferred embodiment of the invention, the at least one piezoelectric motor comprises:
  a second contact surface which contacts and is operative to apply linear motion to a second portion of the flexible material;
  and further comprising:
  a second bearing surface situated on a second side of the flat flexible material opposite said second contact surface.

As with the first bearing surface, the second bearing surface may be a roller or a contact surface of an additional piezoelectric motor. The additional piezoelectric motor preferably cooperates with the second contact surface in the same way as the second piezoelectric motor cooperates with the contact surface.

There is further provided, in accordance with a preferred embodiment of the invention, a method for providing linear motion to a generally flat flexible material, comprising:
  (a) contacting a contact surface of at least one piezoelectric ceramic motor with a first side of the flat flexible material, said at least one motor being operative to impart linear motion to surfaces which are in contact with the contact surface; and
  (b) providing a bearing surface on a second side of the flat flexible material opposite said contact surface.

In one preferred embodiment of the invention the bearing surface is the surface of a roller. In other preferred embodiments of the invention, the bearing surface is a surface associated with another piezoelectric motor.

In these other preferred embodiments of the invention, the bearing surface is a contact surface of a second piezoelectric motor and wherein the second piezoelectric motor also imparts said linear motion to the flat flexible material via said contact surface, preferably the at least one and the second piezoelectric motors both impart linear motion to the flexible material in the same direction.

In one of these other preferred embodiments of the invention, the at least one piezoelectric motor and the second piezoelectric motor impart said linear motion in a given direction during motion periods which alternate with periods during which said motion is not applied and the motion periods of the at least one piezoelectric motor and the second piezoelectric motor at least partially overlap. Preferably, the motion periods of the at least one piezoelectric motor and the second piezoelectric motor is fully contained within the motion period of the other piezoelectric motor. Preferably, the motion periods of the at least one piezoelectric motor and the second piezoelectric motor coincide.

Preferably, the contact surfaces of the at least one piezoelectric motor and the second piezoelectric motor are displaced toward the flexible material during their respective periods of motion such that the material is pinched between the respective contact surfaces.

Alternatively the contact surface of the at least one piezoelectric motor is displaced toward the flexible material during the period of motion of the at least one piezoelectric motor and wherein the contact surface of the second piezoelectric motor is displaced away from the flexible material during the period of motion of the at least one piezoelectric motor. Preferably, the contact surface of the second piezoelectric motor is displaced toward the flexible material during the period of motion of the second piezoelectric motor and wherein the contact surface of the at least one piezoelectric motor is displaced away from the flexible material during the period of motion of the second piezoelectric motor, such that the at least one piezoelectric motor and the second motor alternately apply motion to the flexible material.

In a preferred embodiment of the invention the method includes:

(a) contacting a second contact surface of the at least one piezoelectric ceramic motor with a first side of the flat flexible material, said motor being operative to impart linear motion to surfaces which are in contact with the second contact surface; and (b) providing a second bearing surface on a second side of the flat flexible material opposite said second contact surface.

As with the first bearing surface, the second bearing surface may be a roller or a contact surface of an additional piezoelectric motor. The additional piezoelectric motor preferably cooperates with the second contact surface in the same way as the second piezoelectric motor cooperates with the contact surface.

Additionally, in accordance with a preferred embodiment of the present invention, the piezoelectric ceramic motor has two upper and two lower electrodes and wherein the two upper electrodes are of the same size but different than the size of the two lower electrodes.

BRIEF DESCRIPTION OF THE DRAWINGS

The present invention will be understood and appreciated more fully from the following detailed description taken in conjunction with the drawings in which.

DETAILED DESCRIPTION OF PREFERRED EMBODIMENTS

Figure 1:
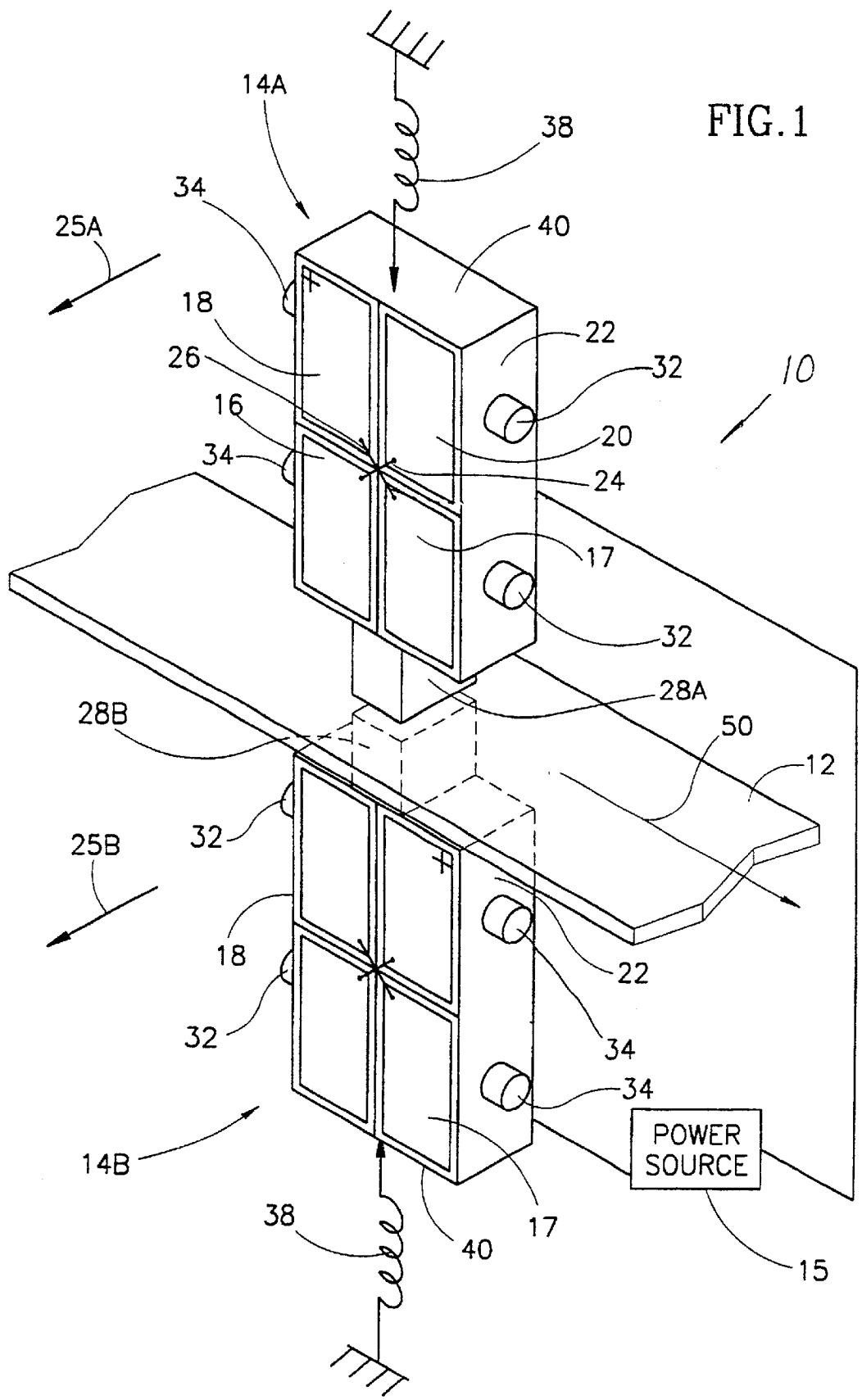
FIG. 1 is a schematic illustration of apparatus for providing linear motion for a flat flexible material, constructed and operative in accordance with a first embodiment of the present invention.

Reference is now made to FIG. 1 which illustrates apparatus 10 for providing linear motion for a delicate material 12, constructed and operative in accordance with a first embodiment of the present invention.

Apparatus 10 comprises upper and lower piezoelectric motor units 14A and 14B, respectively, located along a vertical line, on two opposing sides of delicate material 12. Delicate material 12 is any relatively soft material, which is fragile and flexible, such as paper or cloth. The piezoelectric motor units, generally designated 14, are connected to a power source 15.

Upper and lower piezoelectric motor units 14A and 14B have similar elements and thus similar reference numerals are used throughout. The suffix "A" refers to the upper piezoelectric motor unit 14A and the suffix "B" refers to the lower piezoelectric motor unit 14A.

The piezoelectric motor units 14 can be any type of piezoelectric motor unit, which can provide the desired amount of dynamic force in the desired amount of time. The piezoelectric motors commercially manufactured by Nanomotion Ltd. of Haifa, Israel, are suitable.

The operation of a piezoelectric motor is briefly described herein; the details of its operation can be found in U.S. Pat. No. 5,616,980 to the common assignees of the present invention, the disclosure of which is incorporated by reference.

Four electrodes 16, 17, 18 and 20 are plated or otherwise attached onto the face (hereinafter "the first face") of a piezoelectric ceramic 22 to form a checkerboard pattern of rectangles, each substantially covering one-quarter of the first face. The opposite face ("the second face") of the piezoelectric ceramic 22 is substantially covered with a single electrode (not shown). Diagonally located electrodes (17 and 18, 16 and 20) are electrically connected by wires 24 and 26 preferably placed near the junction of the four electrodes. The electrode on the second face is preferably grounded.

A relatively hard spacer 28 is attached to a short edge of piezoelectric ceramic 22, preferably at the center of the edge.

Piezoelectric ceramic 22 vibrates when electrified. The dimensions of the rectangular large face are preferably chosen such that piezoelectric ceramic 22 has closely spaced resonance frequencies in an X and a Y direction (the short and long directions of the rectangular face of the piezoelectric ceramic 22, respectively), albeit in different modes. Typically, the resonances have overlapping response curves; thus, excitation of the piezoelectric ceramic is achieved by connecting an alternating current (AC) voltage at a frequency at which both modes are excited, to selected ones of the electrodes. When excited, standing waves at the resonant frequencies are formed in ceramic 22 in both the X and Y directions.

Piezoelectric ceramic 22 is generally constrained by a pair of fixed supports 32 and by a pair of resilient supports 34. Supports 34 are typically formed of rubber. Supports 32 and 34 contact piezoelectric ceramic 22 at points of zero movement in the standing wave in the Y direction. The points of zero movement are along a pair of long edges of the ceramic 22. These supports are designed to slide in the Y direction. A resilient support 38 is pressed against the middle of a second short edge, labeled 40, of ceramic 22, opposite the short edge having spacer 28. Support 38 continually supplies pressure (a "preload") between ceramic 22 and the body to be moved, such as material 12, which causes the motion of ceramic 22 to be transmitted to the body to be moved.

It is noted that, when a piezoelectric motor (14A or 14B) is operated, it moves its spacer 28 in both the X and Y directions, where the X and Y directions are defined, as above, as being along the short and long axis, respectively, of the piezoelectric motor. The net effect of the movement of the spacer 28 in both X and Y directions, is elliptical, as described hereinbelow with respect to FIG. 2.

In a preferred embodiment of the present invention, piezoelectric motors 14A and 14B are electrified in the same direction (shown by arrows 25A and 25B). That is, both the upper and lower piezoelectric motor units 14A and 14B, respectively operate in concert. Thus, both spacers 28A and 28B move together alternately, in either the X and Y directions. The diagonally located electrodes (16 and 20) of upper piezoelectric motor 14A, and the opposite diagonally located electrodes (17 and 18) of lower piezoelectric motor 14B are electrically connected together.

Figure 2:
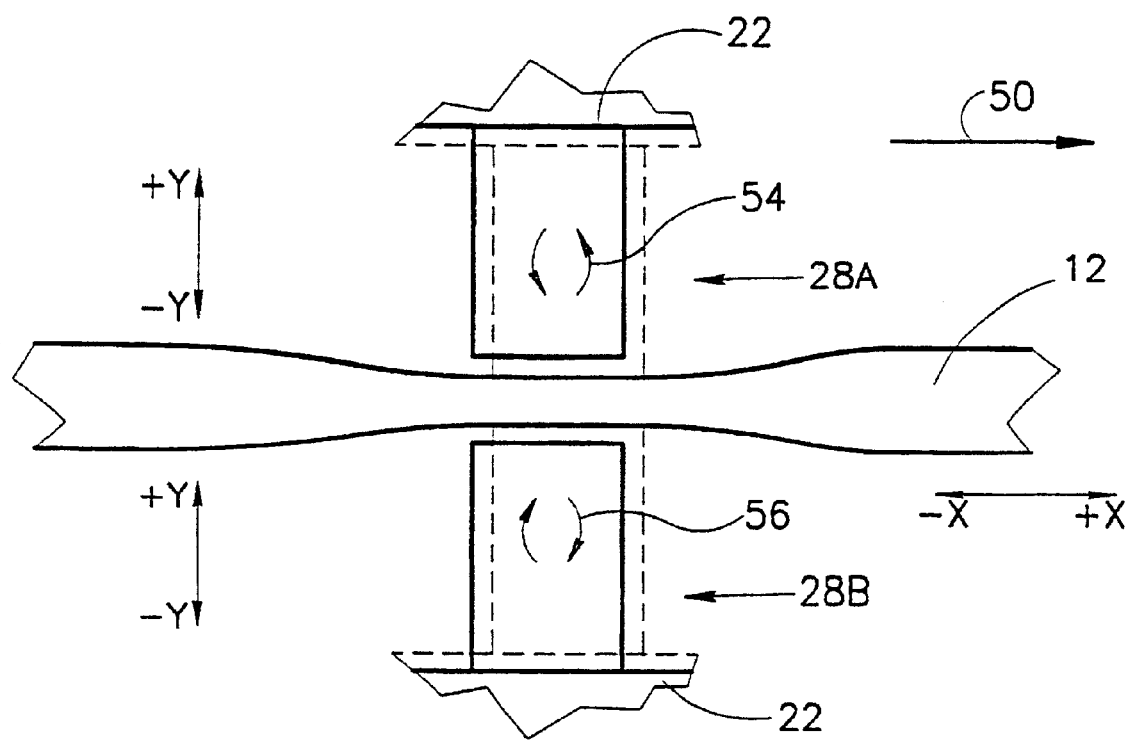
FIG. 2 is an enlarged elevational detail of the apparatus of FIG. 1.

Reference is now made to FIG. 2 which is an enlarged elevational detail showing the movement of material 12 in a forward direction 50. Material 12 is being pressed by the spacers 28 of both piezoelectric motors 14 at the same time. That is, material 12 is subject to pressure in a vertical Y direction. The combination of this vertical Y pressure and forward X movement distorts the material 12 slightly, creating a convex shape, as shown.

The spacers 28 have a two stage cyclical movement., a first stage (a movement period) during which material 12 moves forward and a second stage during which material 12 does not move. The movement of each spacer, in both the Y and X directions, can be defined as having a positive aspect, indicated by arrow "+" and a negative aspect, indicated by arrow "−". Upper spacer 28A moves forward in a positive X direction while it is displaced in a downwards negative Y direction (dashed structure). At the same time, lower spacer 28B moves forward in a positive X direction but upwards in a positive Y direction (dashed structure).

During a second stage the spacers move away from material 12 and in the −x direction.(solid line structure). They then move toward the material and contact the material again and move to the right.

The motion of the upper and lower spacers 28A and 28B is illustrated by arrows 54 and 56 respectively.

In an alternative preferred embodiment of the invention piezoelectric motors are electrified to transfer motion to material 12 alternatively. While each of the spacers moves in the same manner as the spacers of FIG. 2, the spacers move "out of phase" such that they alternatively impart motion in the +x direction. It might be expected that the flexible material would follow this alternating motion and move transverse to the x direction, remaining in contact with both spacers and having no net motion in the +x direction. Surprisingly, this does not happen. It appears that material 12, even if it is flexible, remains generally in place so that it is alternatively contacted by spacers 28A and 28B such that it is alternatively moved by the two motors in the +x direction.

While it is difficult to make measurements of the transverse motion of material 12, it is possible that the material does move up and down together with the motion of the spacers, however, its motion is less than that of the spacers such that net motion is provided in the +x direction.

Figure 3:
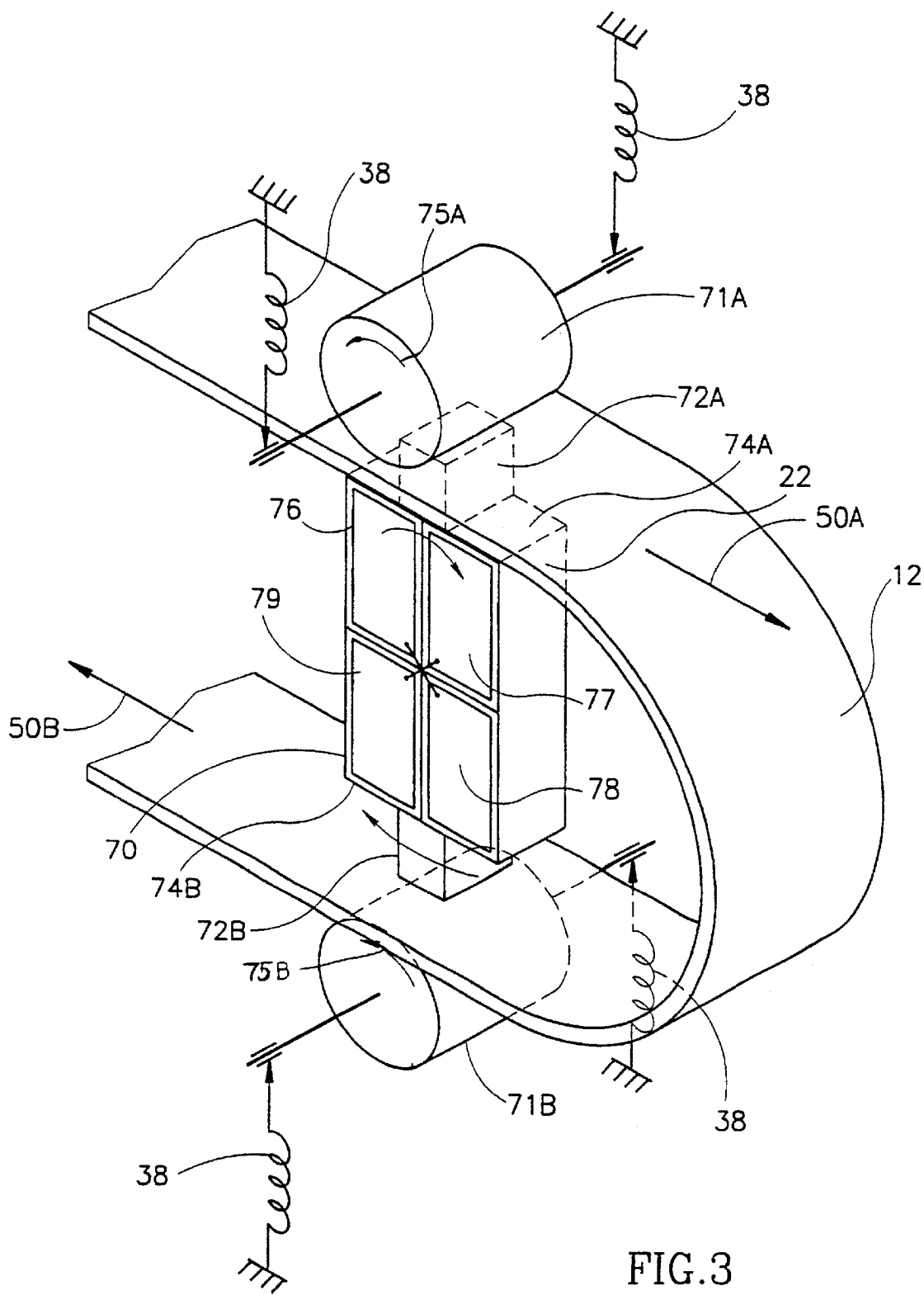
FIG. 3 is a schematic illustration of a second embodiment of the present invention in which a single piezoelectric motor and a pair of roller devices are used in combination for providing horizontal linear motion.

Reference is now made to FIG. 3 which illustrates a further embodiment of the present invention utilizing a single piezoelectric motor 70 and rollers, generally designated 71. First and second rollers 71A and 71B are situated on opposite sides of material 12. Embodiments having similar elements have similar reference numerals throughout.

First and second rollers 71A and 71B are used in place of the upper piezoelectric motor 14A of the embodiment of FIG. 1 to provide pressure on material 12. Rollers 71 are any cylindrical type rollers, known in the art, which are freely rotatable. Pre-loading is provided to the piezoelectric motor 70 and rollers 71 by pre-loading supports 38, as described hereinabove with respect to the embodiment of FIG. 1.

Piezoelectric motor 70 is distinguished from piezoelectric motors 14, described hereinabove with respect to the embodiment of FIG. 1, by having a pair of spacers 72A and 72B attached to short edges 74A and 74B, respectively of piezoelectric ceramic 22. Piezoelectric motor 70 comprises upper electrodes 76 and 77, adjacent to spacer 72A, and lower electrodes 78 and 79 adjacent to spacer 72B. In this embodiment, material 12 is moved around through 180° by the action of piezoelectric motor 70 on both rollers 71A and 71B.

When piezoelectric motor 70 is operated, both spacers 72A and 72B move simultaneously in both the X and Y directions. In this case, both spacers 72A and 72B behave in a manner similar to lower spacer 28B, as described hereinabove with respect to the embodiment of FIG. 1. Spacer 72A moves in an upward direction (+y) and in a forward direction (+x) as in the embodiment of FIG. 1.

The net elliptical effect of the movement of spacer 72A causes material 12 to be pushed along in the X direction (arrow 50A). Roller 71A which is in contact with material 12 is rotated in an anti-clockwise direction by the movement of the material 12, as illustrated by arrow 75A.

The lower part of piezoelectric motor 70 is a mirror image of the upper part. Spacer 72B attached to lower electrodes 78 and 79, acts in a similar manner to spacer 72A. Thus, the material 12 is also moved along in a clockwise direction, indicated by arrow 50B. Roller 71B which is rotated in an anti-clockwise direction by the movement of the material 12, as illustrated by arrow 75B.

It will be appreciated by persons skilled in the art that the combination of a single piezoelectric motor 70 have a spacer at either end, as described hereinabove can also be used to move two separate lines of material 12. That is, one line of material moves in one direction indicated by arrow 50A while a second line of material moves in the opposite direction, indicated by arrow 50A.

Figure 4:
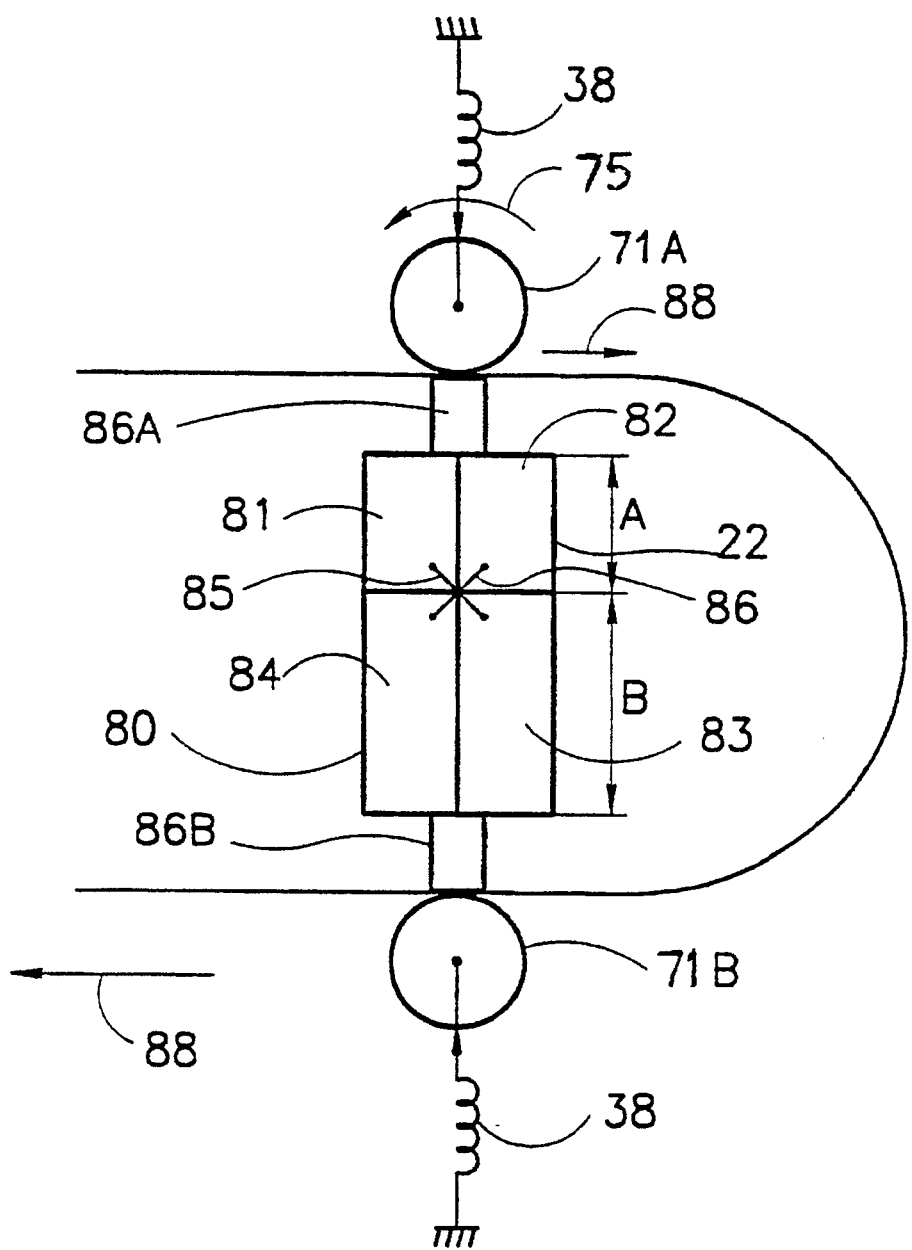
FIG. 4 is a schematic illustration of a third embodiment of the present invention in which a piezoelectric motor is configured to provide differential movement of the material to be moved.

Reference is now made to FIG. 4 which schematically illustrates a further embodiment of the present invention in which piezoelectric motor 80 is configured to provide differential movement of the material to be moved. Since this embodiment is identical to the embodiment of FIG. 3, except for the piezoelectric motor unit 80, only this unit is further described in detail hereinbelow.

Four electrodes 81, 82, 83 and 84 are plated or otherwise attached onto the first face of a piezoelectric ceramic 22 to form a checkerboard pattern of rectangles. The opposite face of the piezoelectric ceramic 22 is substantially covered with a single electrode (not shown). Diagonally located electrodes (81 and 83, 82 and 84) are electrically connected by wires 85 and 86 preferably placed near the junction of the four electrodes. The electrode on the second face is preferably grounded.

Adjacent electrodes 81 and 82 have the same dimensions, each electrode having a length a Similarly, adjacent electrodes 83 and 84 also have the same dimensions of a length b, where b is greater than a. Spacers 86A and 86B are attached to edges of piezoelectric ceramic 22 which are adjacent to pairs of electrodes 81/82 and 83/84 respectively.

Movement in the X direction, indicated by arrow 88, by spacers 86A and 86B depends on the length of the electrodes. The material 12 is thus moved further by spacer 86B than by spacer 86A and is effectively pulled along. Rollers 71A and 71B rotate in an anti-clockwise direction (arrow 75).

Figure 5:
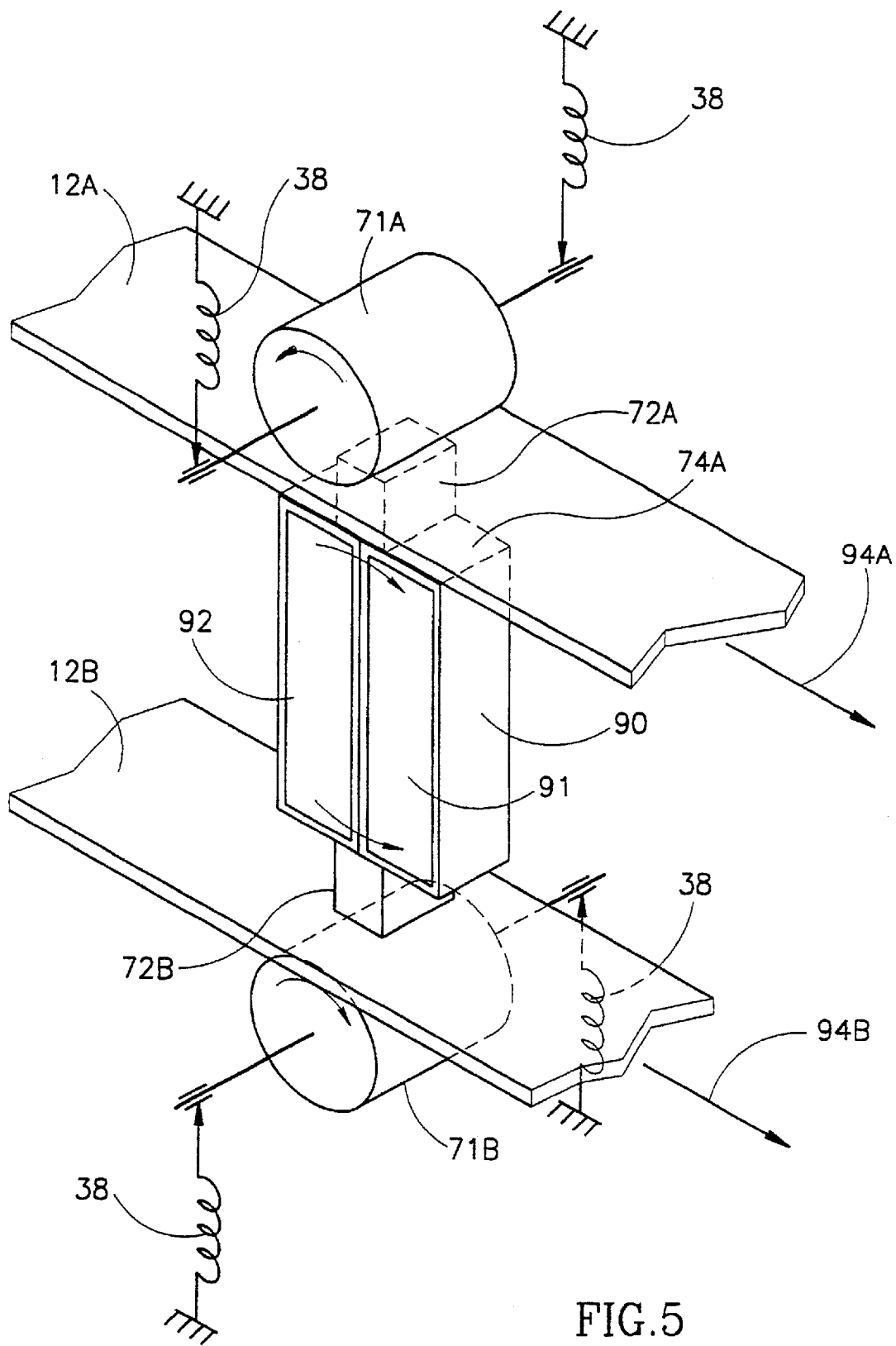
FIG. 5 is a schematic illustration of apparatus for providing linear motion to two individual lines of flat flexible material, constructed and operative in accordance with a fourth embodiment of the invention.

Reference is now made to FIG. 5 which schematically illustrates a further embodiment of the present invention in which a single piezoelectric motor 90 and a pair of rollers 71A and 71B are configured to provide horizontal movement of two separate lengths of material designated 12A and 12B. Since this embodiment is identical to the embodiment of FIG. 3, except for the piezoelectric motor unit 90, only this unit is further described in detail hereinbelow.

Piezoelectric motor 90 comprises two longitudinal electrodes 91 and 92 which are plated or otherwise attached onto the first face of a piezoelectric ceramic 22, each substantially covering one-half of the first face. The opposite face of the piezoelectric ceramic 22 is substantially covered with a single electrode (not shown) which is preferably grounded. Spacers 72A and 72B are attached to short edges 74A and 74B (hidden), respectively of piezoelectric ceramic 22.

In this embodiment, when piezoelectric motor 90 is operated, both spacers 72A and 72A move simultaneously in both the X and Y directions. However, in contrast to the embodiment of FIG. 3, since electrodes 91 and 92 extend longitudinally between spacers 72A and 72B, the net elliptical movement of each spacer causes sheets of material 12A and 12B to move in the same direction, as illustrated by arrows 94A and 94B, respectively.

During the cycle stage when spacer 72A moves in an upward direction (+y) and in a forward direction (+x), spacer 72B moves in an upward direction (-y) and in a backward direction (-x) and is not in contact with material 12B. Thus, when material 12A is pushed along by the vibrations induced by spacer 72A, material 12B is stationary.

During the second part of the cycle, spacer 72B induces material 12B to move and material 12A is stationary.

It will be appreciated by persons skilled in the art that each of longitudinal electrodes 91 and 92 may be replaced by two half size electrodes to create the same effect as described hereinabove.

Figure 6:
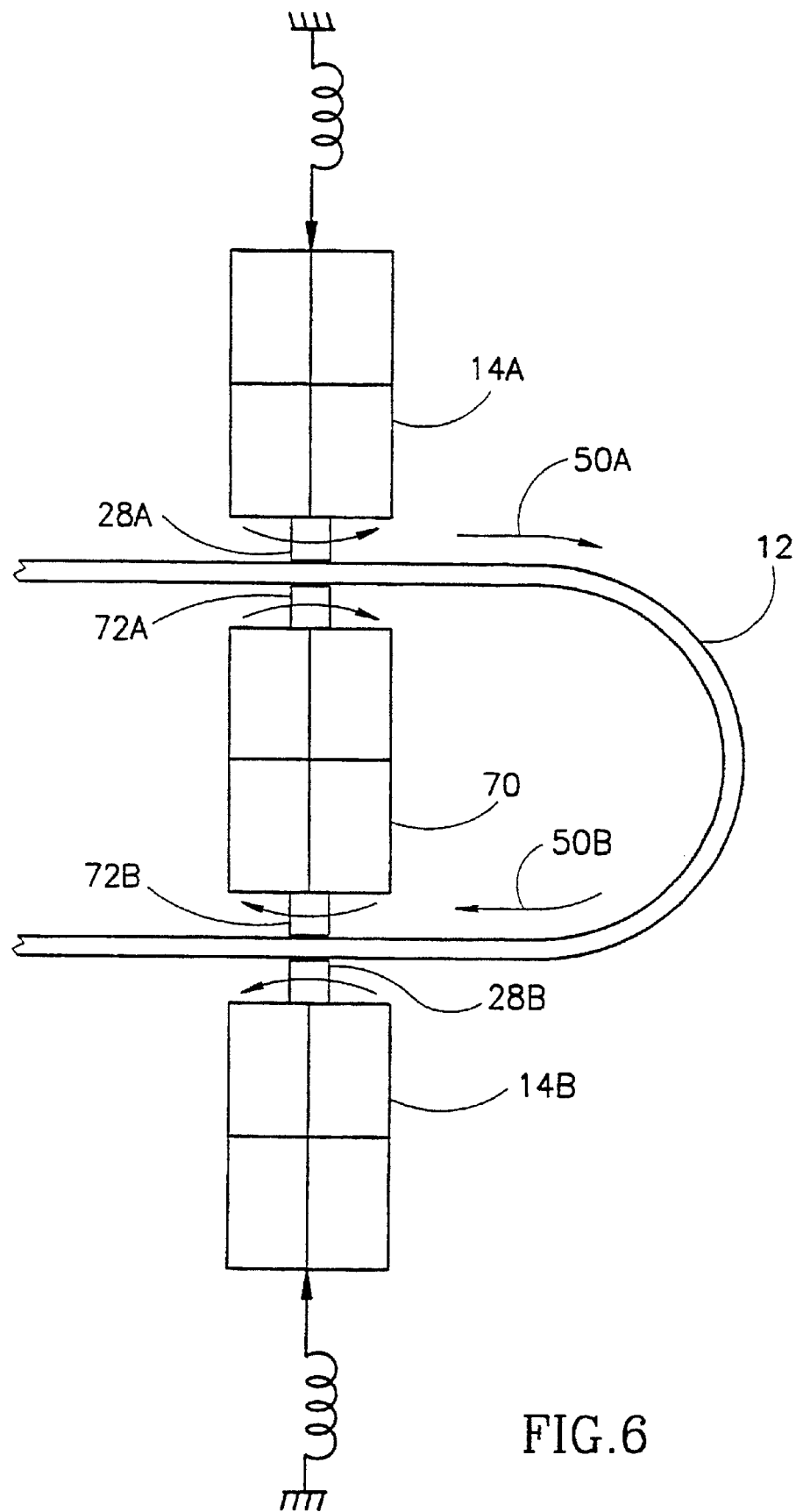
FIG. 6 is a schematic illustration of a fifth embodiment of the present invention in which a three piezoelectric motors provide horizontal linear motion.

Reference is now made to FIG. 6 which illustrates a yet further embodiment of the present invention utilizing three piezoelectric motors 14A, 14B and 70, described hereinabove, to move material 12 around through 180° or to move two separate lines of material in opposite directions. The upper and lower piezoelectric motors 14A and 14B comprise spacers 28A and 28B, respectively, and are similar to the piezoelectric motors described hereinabove with respect to the embodiment of FIG. 1. Piezoelectric motor 70 comprises a pair of spacers 72A and 72B, respectively, and is similar to the piezoelectric motor described hereinabove with respect to the embodiment of FIG. 3, and are therefore not described in any further detail.

Thus, when the three piezoelectric motors 14A, 14B and 70 are operated together, spacers 28A and 72A from piezoelectric motors 14A, and 70, respectively act in a similar manner to spacers 28A and 28B, as described hereinabove with respect to the embodiment of FIG. 1. Thus material 12 moves horizontally in the direction of arrow 50A.

Similarly, spacers 28B and 72B from piezoelectric motors 14B, and 70, respectively also act in a similar manner to spacers 28A and 28B and material 12 moves horizontally in the opposite direction (arrow 50B).

It will be appreciated by persons skilled in the art that the present invention is not limited to AS what has been particularly shown and described hereinabove. Rather the scope of the present invention is defined by the claims which follow:

What is claimed is:

1. Apparatus for providing linear motion to a generally flat flexible material, comprising:
   (a) at least one linear piezoelectric ceramic motor situated on a first side of the flat flexible material and comprising a piezoelectric vibrator having an exclusive contact surface attached thereto which contacts the flat flexible material and imparts said linear motion and wherein a substantially same region of the contact surface contacts the material whenever the motor imparts motion to the material; and
   (b) a bearing surface situated opposite said contact surface on a second side of the flat flexible material,
   wherein the bearing surface is a contact surface of a second piezoelectric motor and wherein the second piezoelectric motor also imparts said linear motion to the flat flexible material via said contact surface of said second piezoelectric motor.

2. Apparatus according to claim 1 wherein the at least one piezoelectric motor and the second piezoelectric motors both impart linear motion to the flexible material in the same direction.

3. Apparatus according to claim 1 and including a source of electrical energy which applies at least one voltage to the at least one piezoelectric motor and to the second piezoelectric motor such that they impart said linear motion in a given direction during motion periods which alternate with periods during which said motion is not applied and wherein the motion periods of the at least one piezoelectric motor and the second piezoelectric motor at least partially overlap.

4. Apparatus according to claim 3 wherein the motion periods of one of the at least one piezoelectric motor and the second piezoelectric motor is fully contained within the motion period of the other of the one and second piezoelectric motor.

5. Apparatus according to claim 3 wherein the motion periods of the at least one piezoelectric motor and the second piezoelectric motor substantially coincide.

6. Apparatus according to claim 3 wherein the source of electrical energy is operative to cause the contact surfaces of the at least one piezoelectric motor and second piezoelectric motor to be displaced toward the flexible material during their respective periods of motion such that the material is pinched between the respective contact surfaces.

7. Apparatus according to claim 3 wherein the source of electrical energy is operative to cause the contact surface of the at least one piezoelectric motor to be displaced toward the flexible material during the period of motion of the at least one piezoelectric motor and to cause the contact surface of the second piezoelectric motor to be displaced away from the flexible material during the period of motion of the at least one piezoelectric motor.

8. Apparatus according to claim 7 wherein the source of electrical energy is operative to cause the contact surface of the second piezoelectric motor to be displaced toward the flexible material during the period of motion of the second piezoelectric motor and to cause the contact surface of the at least one piezoelectric motor to be displaced away from the flexible material during the period of motion of the second piezoelectric motor, such that the at least one piezoelectric motor and second piezoelectric motor alternately apply motion to the flexible material.

9. Apparatus according to claim 1 wherein the at least one piezoelectric motor comprises:
   a second contact surface which contacts and is operative to apply linear motion to a second portion of the flexible material;
   and further comprising:
   a second bearing surface situated opposite said second contact surface on a second side of the flat flexible material.

10. Apparatus for providing linear motion to a generally flat flexible material, comprising:
    (a) at least one linear piezoelectric ceramic motor situated on a first side of the flat flexible material and having a contact surface attached thereto which contacts the flat flexible material and imparts said linear motion and also having a second contact surface which contacts and is operative to apply linear motion to a second portion of the flexible material and wherein the linear motion imparted by the contact surface and the second contact surface are anti-parallel;
    (b) a bearing surface situated opposite said contact surface on a second side of the flat flexible material; and
    (c) a second bearing surface situated opposite said second contact surface on a second side of the flat flexible material.

11. Apparatus according to claim 10 wherein the second bearing surface is a contact surface of another piezoelectric motor and wherein the contact surface of the other piezoelectric motor also imparts said linear motion to the flat flexible material.

12. Apparatus according to claim 11 and including a power supply that applies at least one voltage to the at least one piezoelectric motor and the other piezoelectric motor such that both motors impart linear motion to the flexible material, at the second portion, in the same direction.

13. Apparatus according to claim 11 wherein the power supply causes the second contact surface of the at least one piezoelectric motor and the contact surface of the other piezoelectric motor to impart said linear motion in a given direction during further motion periods which alternate with further periods during which said motion is not applied and wherein the further motion periods of the at least one piezoelectric motor and other piezoelectric motor at least partially overlap.

14. Apparatus according to claim 13 wherein the further motion periods of one of the at least one piezoelectric motor and the other piezoelectric motor is fully contained within the further motion period of the other of the at least one piezoelectric motor and the other piezoelectric motor.

15. Apparatus according to claim 14 wherein the further motion periods of the at least one piezoelectric motor and the other piezoelectric motor coincide.

16. Apparatus according to claim 13 wherein the power supply causes the second contact surface of the at least one piezoelectric motor and the contact surface of the other piezoelectric motor to be displaced toward the flexible material during their respective further periods of motion such that the material is pinched between the respective contact surfaces.

17. Apparatus according to claim 11 wherein the power supply causes the second contact surface of the at least one piezoelectric motor to be displaced toward the flexible material during the further period of motion of the at least one piezoelectric motor and causes the contact surface of the other piezoelectric motor to be displaced away from the flexible material during the further period of motion of the at least one piezoelectric motor.

18. Apparatus according to claim 17 wherein the power supply causes the contact surface of the at other piezoelectric motor to be displaced toward the flexible material during the period of motion of the other piezoelectric motor and causes the second contact surface of the at least one piezoelectric motor to be displaced away from the flexible material during the period of motion of the other piezoelectric motor such that the at least one piezoelectric motor and other piezoelectric motor alternately apply motion to the flexible material.

19. Apparatus according to claim 10 wherein the second bearing surface is the surface of a roller.

20. Apparatus according to claim 1 wherein the material is paper.

21. Apparatus according to claim 1 wherein the material is cloth.

22. A method for providing linear motion to a generally flat flexible material, comprising:
    (a) contacting a contact surface of at least one linear piezoelectric ceramic motor with a first side of the flat flexible material, said contact surface being attached to a single piezoelectric vibrator comprised in the linear motor so that the surface imparts linear motion to portions of the material which are in contact therewith and wherein a substantially same region of the contact surface contacts the material whenever the motor imparts motion to the material; and
    (b) providing a bearing surface situated opposite said contact surface on a second side of the flat flexible material,
    wherein the bearing surface is a contact surface of a second linear piezoelectric motor and wherein the second piezoelectric motor also imparts said linear motion to the flat flexible material.

23. A method according to claim 22 wherein the at least one piezoelectric motor and the second piezoelectric motor both impart linear motion to the flexible material in the same direction.

24. A method according to claim 23 wherein the piezoelectric motors impart said linear motion in a given direction during motion periods which alternate with periods during which said motion is not applied and wherein the motion periods of the at least one piezoelectric and second piezoelectric motor at least partially overlap.

25. A method according to claim 24 wherein the motion periods of one of the at least one piezoelectric and the second piezoelectric motor is fully contained within the motion period of the other piezoelectric motor.

26. A method according to claim 24 wherein the motion periods of the at least one piezoelectric and second piezoelectric motors coincide.

27. A method according to claim 23 and including displacing the contact surfaces of the at least one piezoelectric motor and second piezoelectric motor toward the flexible material during their respective periods of motion such that the material is pinched between the respective contact surfaces.

28. A method according to claims 23 wherein the contact surface of the at least one piezoelectric motor is displaced toward the flexible material during the period of motion of the at least one piezoelectric motor and wherein the contact surface of the second piezoelectric motor is displaced away from the flexible material during the period of motion of the at least one piezoelectric motor.

29. A method according to claim 28 wherein the contact surface of the second piezoelectric motor is displaced toward the flexible material during the period of motion of the second piezoelectric motor and wherein the contact surface of the at least one piezoelectric motor is displaced away from the flexible material during the period of motion of the second piezoelectric motor, such that the at least one piezoelectric motor and second piezoelectric motor alternately apply motion to the flexible material.

30. A method according to claim 22 and including:
   (a) contacting a second contact surface of the at least one ceramic piezoelectric motor with one side of the flat flexible material, said motor being operative to impart linear motion to a second portion of the material which is in contact with the second contact surface; and
   (b) providing a second bearing surface situated opposite said contact surface on another side of the flat flexible material.

31. A method for providing linear motion to a generally flat flexible material, comprising:
   (a) contacting a contact surface of at least one linear piezoelectric ceramic motor with a first side of the flat flexible material, said contact surface being attached to the linear motor such that the surface imparts linear motion to portions of the material which are in contact therewith; and
   (b) providing a bearing surface situated opposite said contact surface on a second side of the flat flexible material;
   (c) contacting a second contact surface of the at least one ceramic piezoelectric motor with one side of the flat flexible material, said motor being operative to impart linear motion to a second portion of the material which is in contact with the second contact surface and wherein the linear motion imparted by the contact surface and the second contact surface are anti-parallel; and
   (d) providing a second bearing surface situated opposite said second contact surface on another side of the flat flexible material.

32. A method according to claim 31 wherein the second bearing surface is a contact surface of another piezoelectric motor and wherein the contact surface of the other piezoelectric motor also imparts said linear motion to the flat flexible material.

33. A method according to claim 32 wherein the at least one piezoelectric motor and the other piezoelectric motor both impart linear motion to the flexible material, at the second portion, in the same direction.

34. A method according to claim 32 wherein the second contact surface of the at least one piezoelectric motor and the contact surface of the other piezoelectric motor impart said linear motion in a given direction during further motion periods which alternate with further periods during which said motion is not applied and wherein the further motion periods of the at least one piezoelectric motor and other piezoelectric motors at least partially overlap.

35. A method according to claim 34 wherein the further motion periods of one of the at least one piezoelectric motor and the other piezoelectric motor is fully contained within the further motion period of the other of the at least one and other piezoelectric motors.

36. A method according to claim 35 wherein the further motion periods of the at least one piezoelectric and the other piezoelectric motor coincide.

37. A method according to claim 34 wherein the second contact surface of the at least one piezoelectric motor and the contact surface of the other piezoelectric motor are displaced toward the flexible material during their respective further periods of motion such that the material is pinched between the respective contact surfaces.

38. A method according to claim 33 wherein the second contact surface of the at least one piezoelectric motor is displaced toward the flexible material during the further period of motion of the at least one piezoelectric motor and wherein the contact surface of the other piezoelectric motor is displaced away from the flexible material during the further period of motion of the at least one piezoelectric motor.

39. Apparatus according to claim 38 wherein the contact surfaces of the other piezoelectric motor is displaced toward the flexible material during the period of motion of the other piezoelectric motor and wherein the contact surface of the at least one piezoelectric motor is displaced away from the flexible material during the period of motion of the other piezoelectric motor such that the at least one piezoelectric motor and other piezoelectric motor alternately apply motion to the flexible material.

40. A method according to claim 31 wherein the second bearing surface is the surface of a roller.

41. A method according to claim 22 wherein the material is paper.

42. A method according to claim 22 wherein the material is cloth.

* * * * *